US012577499B2

(12) United States Patent
Tamboli

(10) Patent No.: US 12,577,499 B2
(45) **Date of Patent: *Mar. 17, 2026**

(54) POST CHEMICAL MECHANICAL PLANARIZATION (CMP) CLEANING

(71) Applicant: Versum Materials US, LLC, Tempe, AZ (US)

(72) Inventor: Dnyanesh C. Tamboli, Gilbert, AZ (US)

(73) Assignee: Versum Materials US LLC, Tempe, AZ (US)

( * ) Notice: Subject to any disclaimer, the term of this patent is extended or adjusted under 35 U.S.C. 154(b) by 148 days.

This patent is subject to a terminal disclaimer.

(21) Appl. No.: 18/066,815

(22) Filed: Dec. 15, 2022

(65) Prior Publication Data

US 2023/0183611 A1 Jun. 15, 2023

Related U.S. Application Data

(63) Continuation of application No. 16/444,490, filed on Jun. 18, 2019, now Pat. No. 11,560,533.

(Continued)

(51) Int. Cl.
*C11D 1/00* (2006.01)
*C11D 1/22* (2006.01)
(Continued)

(52) U.S. Cl.
CPC .............. *C11D 3/2079* (2013.01); *C11D 1/22* (2013.01); *C11D 3/2082* (2013.01);
(Continued)

(58) Field of Classification Search
CPC ....... C11D 1/00; C11D 3/2075; C11D 3/2086; C11D 3/245; C11D 3/30; C11D 3/37;
(Continued)

(56) References Cited

U.S. PATENT DOCUMENTS 5,230,833 A 7/1993 Romberger
6,147,002 A * 11/2000 Kneer .................... C11D 3/046 438/692

(Continued)

FOREIGN PATENT DOCUMENTS

CN 1735671 2/2006
CN 101290482 A 10/2008

(Continued)

OTHER PUBLICATIONS

European Search Report; EP19182719; The Hague; Oct. 28, 2019.

(Continued)

*Primary Examiner* — Brian P Mruk
(74) *Attorney, Agent, or Firm* — Versum Materials US LLC

(57) ABSTRACT

Provided are formulations that offer a high cleaning effect on inorganic particles, organic residues, chemical residues, reaction products on the surface due to interaction of the wafer surface with the Chemical Mechanical Planarization (CMP) slurry and elevated levels of undesirable metals on the surface left on the semiconductor devices after the CMP. The post-CMP cleaning formulations comprise one or more organic acid, one or more polymer and a fluoride compound with pH <7 and optionally a surfactant with two sulfonic acid groups.

10 Claims, 1 Drawing Sheet

Related U.S. Application Data

(60) Provisional application No. 62/690,108, filed on Jun. 26, 2018.

(51) Int. Cl.

| | |
|---|---|
| ***C11D 3/20*** | (2006.01) |
| ***C11D 3/22*** | (2006.01) |
| ***C11D 3/30*** | (2006.01) |
| ***C11D 3/37*** | (2006.01) |
| ***H01L 21/02*** | (2006.01) |
| *C11D 1/02* | (2006.01) |

(52) U.S. Cl.

CPC ............ *C11D 3/2086* (2013.01); *C11D 3/225* (2013.01); *C11D 3/3707* (2013.01); *C11D 3/378* (2013.01); *H01L 21/02065* (2013.01); *H01L 21/02074* (2013.01); *C11D 1/02* (2013.01)

(58) Field of Classification Search

CPC ..... C11D 3/3707; C11D 3/3746; C11D 3/378; H01L 21/02041

See application file for complete search history.

(56) References Cited

U.S. PATENT DOCUMENTS

| | | | | |
|---|---|---|---|---|
| 6,440,856 | B1 | 8/2002 | Bessho et al. | |
| 6,730,644 | B1 | 5/2004 | Ishikawa et al. | |
| 7,084,097 | B2 | 8/2006 | Ishikawa et al. | |
| 7,163,644 | B2 | 1/2007 | Akahori et al. | |
| 7,396,806 | B2 | 7/2008 | Sakai et al. | |
| 7,427,362 | B2 | 9/2008 | Liu | |
| 7,497,966 | B2 | 3/2009 | Nam et al. | |
| 11,560,533 | B2 * | 1/2023 | Tamboli ............ | H01L 21/02065 |
| 2002/0025762 | A1 | 2/2002 | Luo | |
| 2003/0129078 | A1 | 7/2003 | Beardwood et al. | |
| 2005/0067164 | A1 | 3/2005 | Ke et al. | |
| 2005/0197266 | A1 | 9/2005 | Misra et al. | |
| 2005/0284844 | A1 | 12/2005 | Hattori | |
| 2010/0035436 | A1 * | 2/2010 | Kim ........................ | C09K 13/08 252/79.3 |
| 2012/0172272 | A1 * | 7/2012 | Park .......................... | C11D 7/08 510/175 |
| 2013/0225464 | A1 * | 8/2013 | Harada .................. | C11D 1/008 510/175 |
| 2016/0010035 | A1 | 1/2016 | Liu et al. | |
| 2017/0183538 | A1 | 6/2017 | Kwon | |

FOREIGN PATENT DOCUMENTS

| | | | |
|---|---|---|---|
| CN | 101295143 | A | 10/2008 |
| CN | 102007196 | | 4/2011 |
| CN | 102533273 | | 7/2012 |
| CN | 103782373 | | 5/2014 |
| JP | 1181494 | A2 | 7/1989 |
| JP | 2006041494 | A | 2/2006 |
| JP | 2007027382 | A | 2/2007 |
| WO | 0072363 | A1 | 11/2000 |
| WO | 2007092800 | A2 | 8/2007 |
| WO | 2008128419 | A1 | 10/2008 |
| WO | 2012154498 | A2 | 11/2012 |
| WO | 2017156304 | A1 | 9/2017 |

OTHER PUBLICATIONS

Intellectual Property Office of Singapore; Application No. 10201905930X; Aug. 3, 2021.

The State Intellectual Property Office of the People's Republic of China; Patent Search Report; Application No. 2019105608181; Jul. 17, 2020.

* cited by examiner

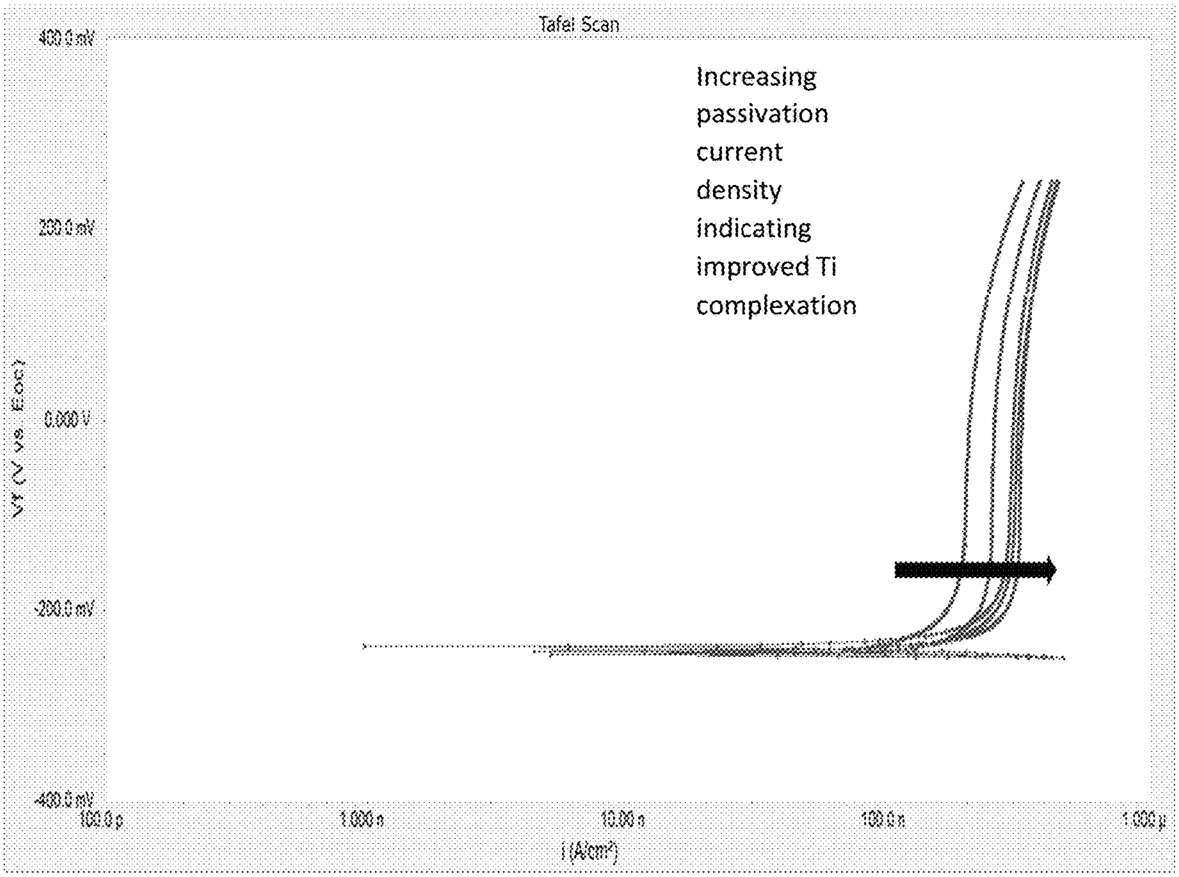
Tafel Scan
Increasing passivation current density indicating improved Ti complexation
400.0 mV
200.0 mV
0.000 V
-200.0 mV
-400.0 mV
Vf (V vs. Eoc)
100.0 p
1.000 n
10.00 n
100.0 n
1.000 µ
i (A/cm²)

POST CHEMICAL MECHANICAL PLANARIZATION (CMP) CLEANING

CROSS REFERENCE TO RELATED PATENT APPLICATIONS

The present patent application is a continuation application of U.S. patent application Ser. No. 16/444,490 filed on 18 Jun. 2019, now U.S. Pat. No. 11,560,533, which claims the benefit of U.S. Provisional Patent Application Ser. No. 62/690,108 filed on 26 Jun. 2018; which are entirely incorporated herein by reference.

BACKGROUND OF THE INVENTION

In the steps involving making of the semiconductor devices, cleaning is required at various steps to remove organic/inorganic residues. Cleaning to improve residue removal desired in semiconductor manufacturing processing, include; post-CMP (chemical mechanical planarization) cleaning, photo-resist ash residue removal, photoresist removal, various applications in back-end packaging such as pre-probe wafer cleaning, dicing, grinding etc.

A particular need for improved cleaning exists in post CMP cleaning of various structures formed by chemical mechanical planarization (CMP) process. CMP process involves polishing of one or more layers of films deposited on a wafer by pressing the wafer against a polishing pad with a CMP slurry providing the abrasive effect for material removal and provide planarity.

After the CMP step, the wafer surface contains a large number of defects, which if not cleaned from the surface would result in a defective chip as an end-product. Typical defects after a CMP process are inorganic particles, organic residues, chemical residues, reaction products on the surface due to interaction of the wafer surface with the CMP slurry and elevated levels of undesirable metals on the surface. After the polishing step, the wafer is cleaned, most commonly using a brush scrubbing process. During this process, a cleaning chemistry is dispensed on the wafer to clean the wafer. The wafer is also rinsed with deionized (DI) water, before a drying process is performed.

Prior work has been done in the generally in the field of the present application include: JP 11-181494; U.S. Pat. Nos. 6,440,856; 7,497,966 B2; 7,427,362 B2; 7,163,644 B2; PCT/US2007/061588; U.S. Pat. Nos. 7,396,806; 6,730,644; 7,084,097; 6,147,002; US 2003/0129078; and, US 2005/0067164.

As the technology advances, the threshold size and number of the defects that are critical for production yield of semiconductor wafers become smaller, thereby increasing the performance requirements of the post-CMP cleaners. Advanced semiconductor devices comprising tungsten interconnect pose specific challenges resulting from metallic residues causing degradation of electrical performance. The root-cause of metallic residues is often iron compounds used in polishing slurries and the precipitation of titanium compounds from the removal of titanium based barriers in the polishing step. It is therefore critical for cleaning formulations to remove these metallic residues to provide desired electrical performance for the semiconductor devices. The formulations or compositions (formulation and composition are exchangeable) in the present invention were found to be very effective in removing the residues left behind by the above described CMP polishing process.

BRIEF SUMMARY OF THE INVENTION

Described herein are post-CMP cleaning compositions, methods and systems for the post-CMP processing.

In one aspect, the present invention provides a cleaning composition comprising: water; at least one organic acid or salts thereof, a fluoride compound, a polymeric additive, and optionally a surfactant, corrosion inhibitors, defoaming agent, biological preservatives, pH adjusting agents.

Polymeric additive may be selected from a group comprising anionic, cationic and nonionic polymers or copolymers. The polymeric additive may be selected from but not limited to a group comprising acrylic acid-acrylamido propane sulfonic acid copolymer, poly(acrylic acid), poly(methacrylic acid), poly(2-acrylamido-2-methyl-1-propanesulfonic acid), carboxymethyl cellulose, methyl cellulose, hydroxypropyl methyl cellulose, poly-(1-vinylpyrrolidone-co-2-dimethylaminoethyl methacrylate), poly(sodium 4-styrenesulfonate), poly(ethylene oxide), poly(4-styrenesulfonic acid), polyacrylamide, poly(acrylamide/acrylic acid) copolymers, and combinations thereof, and salts thereof.

In preferred embodiments, formulations comprise anionic polymers. Preferred anionic polymer is acrylic acid-acrylamido propane sulfonic acid copolymer.

Another preferred polymer/copolymers are non-ionic polymers comprising ethylene oxide (EO) groups.

The at least one organic acid or salts thereof may be selected preferably from a group comprising of dicarboxylic acids or salts thereof, hydroxycarboxylic acids or salts thereof and polycarboxylic acids or salts thereof. Preferred organic acids or salts thereof are oxalic acid and citric acid or salts thereof. Organic acid or salts thereof concentration in the formulation may be in the range of 1 to 30 wt. %, or more preferably between 5 to 20%, wherein the composition is diluted with water 2 to 500 times at the point of use.

Formulations also comprises a fluoride compound. Examples of fluoride compounds include hydrofluoric acid, ammonium fluoride, ammonium bifluoride, quaternary ammonium fluorides. Preferred compound is ammonium fluoride. Concentration of fluoride component in the formulation is in the range of 1 to 25 wt. %, or between 2 to 20 wt. %, 3 to 18 wt. % or between 4 and 10 wt. %, wherein the formulation is diluted 2 to 500 times at the point of use.

In another preferred embodiment, the cleaning composition comprises 1 to 15 wt. % organic acids or salts thereof, 0.05 to 3 wt. % polymer/copolymer(s), 1-25 wt. % of fluoride compound, water wherein the composition may be diluted with DI water 2 to 500 times at the point of use.

In another preferred embodiment, the cleaning composition comprises 1 to 30 wt. % organic acids or salts thereof, 0.05 to 3 wt. % polymer, 1 to 25 wt. % of fluoride compound, water wherein the composition may be diluted with DI water 2 to 500 times at the point of use and the polymer is selected from a group comprising of anionic polymer/copolymer and a non-ionic polymer/copolymer comprising ethylene oxide (EO) groups.

In another preferred embodiment, the cleaning composition comprises 1 to 30 wt. % organic acids or salts thereof, 0.05 to 3 wt. % polymer/copolymers, 1 to 25 wt. % of fluoride compound, water wherein the composition may be diluted with DI water 2 to 500 times at the point of use and at least one polymer is anionic polymer/copolymer and a non-ionic polymer/copolymer comprising ethylene oxide (EO) groups.

In another preferred embodiment, the cleaning composition comprises 1 to 30 wt. % organic acids or salts thereof, 0.05 to 3 wt. % polymer/copolymers, 1 to 25 wt. % of fluoride compound, water wherein the composition may be diluted with DI water 2 to 500 times at the point of use and the polymer is selected from a group comprising of acrylic acid-acrylamido propane sulfonic acid copolymer and a non-ionic polymer/copolymer comprising ethylene oxide (EO) groups.

In another preferred embodiment, the cleaning composition comprises 1 to 30 wt. % organic acids or salts thereof, 0.05 to 3 wt. % polymer mixture, 1 to 25 wt. % of fluoride compound, water wherein the composition may be diluted with DI water 2 to 500 times at the point of use and at least one copolymer is an acrylic acid-acrylamido propane sulfonic acid copolymer and another a non-ionic polymer/copolymer comprising ethylene oxide (EO) groups.

In another preferred embodiment, the formulation comprises, 0.5 to 5 wt. % oxalic acid, 0.5 to 5 wt. % citric acid or salts thereof, 0.5 to 5 wt. % malonic acid or salts thereof; 0.1 to 2 wt. % acrylic acid-acrylamido propane sulfonic acid copolymer; 1 to 25 wt. % of fluoride compound and water wherein the composition may be diluted with DI water 2 to 500 times at the point of use In another preferred embodiment, the formulation comprises, 0.5 to 5 wt. % oxalic acid, 0.5 to 5 wt. % citric acid or salts thereof, 0.5 to 5 wt. % malonic acid; 0.1 to 3 wt. % non-ionic polymer or copolymer comprising ethylene oxide groups; 1 to 25 wt. % of fluoride compound and water wherein the composition may be diluted with DI water 2 to 500 times at the point of use In another preferred embodiment, the formulation comprises, 0.5 to 5 wt. % oxalic acid, 0.5 to 5 wt. % citric acid, 0.5 to 5 wt. % malonic acid or salts thereof; 0.1 to 3 wt. % non-ionic polymer or copolymer comprising ethylene oxide groups; 0.1 to 2 wt. % of anionic polymer, 1-25 wt. % of fluoride compound and water wherein the composition may be diluted with DI water 2 to 500 times at the point of use In another preferred embodiment, the formulation comprises, 1 to 30 wt. % citric acid or salts thereof; 0.1 to 3 wt. % acrylic acid-acrylamido propane sulfonic acid copolymer; 1-25 wt. % of fluoride compound and water, wherein the composition may be diluted with DI water 2 to 500 times at the point of use In another preferred embodiment, the formulation comprises, 1 to 30 wt. % citric acid or salts thereof; 0.1 to 3 wt. % non-ionic polymer or copolymer comprising ethylene oxide groups; 1-25 wt. % of fluoride compound and water, wherein the composition may be diluted with DI water 2 to 500 times at the point of use In another preferred embodiment, the formulation comprises, 1 to 30 wt. % citric acid or salts thereof; 0.1 to 3 wt. % non-ionic polymer or copolymer comprising ethylene oxide groups and 0.1-3 wt. % of anionic polymer; 1-25 wt. % of fluoride compound and water, wherein the composition may be diluted with DI water 2 to 500 times at the point of use In another preferred embodiment, the formulation comprises, 1 to 30 wt. % citric acid; 0.1-5 wt. % oxalic acid or salts thereof, 0.1 to 3 wt. % acrylic acid-acrylamido propane sulfonic acid copolymer and water; wherein the composition may be diluted with DI water 2 to 500 times at the point of use In another preferred embodiment, the formulation comprises 1 to 30 wt. % organic acids or salts thereof, 0.1 to 3 wt. % polymer, 1-25 wt. % of fluoride compound, 0.01 to 3 wt. % of a surfactant and water wherein the composition may be diluted with DI water 2 to 500 times at the point of use.

In another preferred embodiment, the cleaning composition comprises 1 to 30 wt. % organic acids or salts thereof, 0.1 to 3 wt. % polymer, 1-25 wt. % of fluoride compound, 0.01 to 3 wt. % of a surfactant comprising two negatively charged anionic groups and water wherein the composition may be diluted with DI water 2 to 500 times at the point of use.

In another preferred embodiment, the cleaning composition comprises 1 to 30 wt. % organic acids or salts thereof, 0.1 to 3 wt. % polymer, 1-25 wt. % of fluoride compound, 0.01 to 3 wt. % of a diphenyl disulfonic surfactant and water wherein the composition may be diluted with DI water 2 to 500 times at the point of use.

pH of the formulation is preferably between 1 and 7, or more preferably between 3 and 6 or most preferably between 4 and 5, wherein formulation is diluted with DI water 2 to 500 times at the point of use.

The compositions of this invention can be used for cleaning semiconductor wafers comprising at least one or more of metallic or dielectric films on the surface. Metallic films may comprise interconnect metal lines or vias comprising copper, tungsten, cobalt, aluminum, ruthenium, or their alloys. The dielectric layer can be silicon oxide films such as those derived from Tetra Ethyl Ortho Silicate (TEOS) precursors, dielectric films with one or more elements such as silicon, carbon, nitrogen, oxygen and hydrogen. Dielectric films can be porous or non-porous or the structures may comprise air gaps.

Cleaning compositions may be used for cleaning the wafer surface with various types of cleaning techniques including but not limited to brush box cleaning, spray cleaning, megasonic cleaning, buff cleaning on a pad, single wafer spray tools, batch immersion cleaning tools, etc.

In certain preferred embodiments, the cleaning composition when diluted with water can etch the dielectric films at an etch rate preferably between 0.2 to 50 Angstroms/min, or more preferably between 1 and 20 Angstroms/min., or most preferably between 1 to 10 angstroms/min.

In certain preferred embodiments, the cleaning composition when diluted with water can etch dielectric films at etch rate between 1 to 10 Angstroms/min and etch tungsten at etch rates less than 1 Angstroms/min and etch titanium nitride films at etch rates less than 5 angstroms/min at room temperature, when the etching time is five minutes or less for the titanium nitride films.

In another aspect, the invention is a method of post CMP cleaning semiconductor wafer comprising at least one or more of metallic or/and dielectric films, comprising providing the semiconductor wafer;

providing the post CMP cleaning compositions above; and cleaning the semiconductor wafer using the post CMP cleaning composition to remove.

In yet another aspect, the invention is a system for post CMP cleaning semiconductor wafers comprising at least one or more of metallic or/and dielectric film, comprising the semiconductor wafer;

the post CMP cleaning compositions above;

wherein at least part of the metallic or dielectric film is in touch with the post CMP cleaning composition.

BRIEF DESCRIPTION OF SEVERAL VIEWS OF THE DRAWINGS

FIG. 1 shows the polarization diagrams providing the passivation current densities of various chemicals tested at 0.2 wt. % concentration

DETAILED DESCRIPTION OF THE INVENTION

Described and disclosed herein are compositions for cleaning in semiconductor manufacturing including post- CMP (chemical mechanical planarization) cleaning, photoresist ash residue removal, photoresist removal, various applications in back-end packaging such as pre-probe wafer cleaning, dicing, grinding etc. The formulations are most suitable as post-CMP cleaning formulations.

Formulations of this invention are especially useful for post-CMP cleaning formulations after CMP processes including metal CMP processes wherein CMP process leads to formation of metallic interconnect structures surrounded by dielectric and dielectric CMP processes wherein one or more dielectrics are polished to form a planar surfaces or structures. Examples of metal CMP processes include but not limited to tungsten CMP, copper CMP, cobalt CMP, ruthenium CMP, aluminum CMP wherein metallic lines or vias separated by a dielectric region are formed. Examples of dielectric CMP include Shallow Trench Isolation (STI) CMP wherein silicon oxide structures are formed separated by silicon nitride regions and Inter Layer Dielectric (ILD) polish.

Formulations of this invention can effectively cleans substrates after polishing with slurries with various types of particles include but are not limited to colloidal silica, surface charge modified silica particles (positive as well as negative charged), fumed silica, ceria (calcined and colloidal), alumina, zirconia, composite particles comprising two or more different types of particles.

In one of the preferred embodiments, cleaning formulations of this invention are used for post-CMP cleaning after tungsten CMP. Formulations of this invention are especially effective for removal of metallic residues such as Fe, W, Ti and TiN that are typically formed on the wafer surface after tungsten CMP, while at the same time significantly improving organic and inorganic residue removal capabilities. Formulations of this invention are suitable for reducing the corrosion of tungsten, lowering surface roughness and reducing galvanic corrosion between tungsten and liner materials.

The cleaning chemistry comprises at least one organic acid or salts thereof, a fluoride compound, a polymeric additive, water and optionally a surfactant, corrosion inhibitors, biological preservatives, defoaming agent; pH adjusting agents.

Organic acids or mixtures thereof: Organic acid or salts thereof can be chosen from a broad range of acids or salts thereof, such as monocarboxylic acids, dicarboxylic acid, polycarboxylic acids, hydroxycarboxylic acids, or mixtures thereof. Specific examples of organic acids include but not limited to; oxalic acid, citric acid, maleic acid, malic acid, malonic acid, gluconic acid, glutaric acid, ascorbic acid, formic acid, acetic acid, ethylene diamine tetraacetic acid, diethylene triamine pentaacetic acid, glycine, α-alanine, cystine etc. Salts of these acids may also be used. A mixture of acids/salts may be used as well. Organic acids function to improve trace metal removals, remove organic residues, pH adjustment or reduce corrosion of metals. In preferred embodiments, the formulations comprise at-least one hydroxycarboxylic acid. Examples of hydroxycarboxylic acid include but not limited to citric acid, gluconic acid, lactic acid, glycolic acid, tartaric acid, mandelic acid, malic acid and salicylic acid. Hydroxycarboxylic acid are found especially useful for removing titanium related residues from the wafer surface. In some preferred embodiments, cleaning formulations also comprise dicarboxylic acid which are effective for removing iron related compounds from the wafer surface. Examples of dicarboxylic acids include but not limited to oxalic acid, malonic acid, succinic acid and glutaric acid In one embodiment, the cleaning composition comprises one or more organic acids selected comprising oxalic acid, citric acid, malonic acid, glycine and α-alanine. In another embodiment of the cleaning composition the comprises a mixture of oxalic acid, citric acid and malonic acid. In another preferred embodiment organic acid contains citric acid. In another embodiment organic acid comprise a mixture of citric acid and oxalic acid.

The cleaning chemistry may contain from 1 wt. % to 30 wt. % or more preferably between 5 wt. % and 20 wt. % of at least one organic acids/salts.

Cleaning formulation may comprise a water-soluble polymeric additive. Polymer may be a homopolymer or copolymer. The polymer may contain positively charged species (cationic polymer), negatively charged groups (anionic polymers), nonionic groups (nonionic polymers) or both cationic and anionic groups (zwitterionic polymers). The polymer may be selected from but not limited to a group comprising acrylic acid-acrylamido propane sulfonic acid copolymer, AA-AMPS, poly(acrylic acid), poly(methacrylic acid), poly(2-acrylamido-2-methyl-1-propanesulfonic acid), carboxymethyl cellulose, methyl cellulose, hydroxypropyl methyl cellulose, poly-(1-vinylpyrrolidone-co-2-dimethylaminoethyl methacrylate), poly(sodium 4-styrenesulfonate), poly(ethylene oxide) or poly(ethylene glycol), poly(4-styrenesulfonic acid), polyacrylamide, poly (acrylamide/acrylic acid) copolymers, polyvinyl alcohol, and combinations thereof, and salts thereof. Molecular weight of the polymers may range from 100 to 10,000,000. Molecular weight may be measured by any suitable techniques such as gel permeation chromatography (GPC), mass spectrometry (MALDI TOF-MS) and light scattering.

In some embodiments formulations comprises one or more anionic polymer or copolymers. Preferred anionic polymer is acrylic acid-acrylamido propane sulfonic acid copolymer (AA-AMPS). In preferred embodiments the molecular weight of the polymer may be between 100-1,000,000, or more preferably between 200 and 100,000 or most preferable between 1000 and 10,000. In some more preferred embodiments, the acrylic acid (x): 2-acrylamido-2-methylpropanesulfonic acid (y) mole ratio (x:y) in the copolymer is between 90:10 to 70:30.

An example of preferred AA-AMPS copolymer that is used in the working examples is Dequest® P9300 available Italmatch Chemicals (Genova, Italy).

In some other embodiments formulations comprises one or more polymer or copolymer, which is non-ionic in nature and comprises ethylene oxide (EO) groups. Examples of such polymer or copolymers include polyethylene glycol or a copolymer of ethylene oxide (EO) and polypropylene oxide (PO) groups in various configurations such as EO-PO-EO or PO-EO-PO. Molecular weight range between 100-1,000,000, or more preferably between 200 and 100,000 or most preferable between 200 and 50,000.

In some preferred embodiments, the formulations comprise both anionic polymer/copolymer(s) and non-ionic polymer/copolymer(s) comprising ethylene oxide groups.

Addition of the polymers to post CMP formulations with appropriate bases leads to great improvement in cleaning performance. Without binding to any particular mechanism, one of the possible mechanism may be physical adsorption on surfaces, which would prevent re-deposition of removed particles and other residues. Another likely mechanism is the strong affinity towards the residues (organics) thereby increasing the driving force on lift-off during the cleaning process. Non-ionic polymeric additives comprising EO groups may form bonding with the hydrated silica surfaces and forming a polymeric coating helping remove the particles.

These types of polymers or mixtures thereof can be added in concentrations from 0.01 to 10 wt. % to the cleaning formulations. A preferred concentration range is between 0.1% to 5 wt. %. The formulations may be diluted by a by a factor of 2 to 500 at point of use through addition of solvent, such as water. Alternatively, the formulations may be supplied in diluted form for the direct use without the dilution at the point of use.

Formulations also comprises a fluoride compound. Examples of fluoride compounds include hydrofluoric acid, ammonium fluoride, ammonium bifluoride, quaternary ammonium fluorides. Preferred compound is ammonium fluoride. Concentration of fluoride component in the formulation is preferably in the range of 1 to 25 wt. %, or more preferably between 3 to 20 wt. % or most preferably between 4 and 18 wt. %, wherein the formulation is diluted 2 to 500 times at the point of use. In acidic pH, the fluoride species may undergo dissociation and may form different types of fluoride ions. For example, an acidic formulation with a fluoride salt such as ammonium fluoride may have three different species hydrofluoric acid (HF), fluoride ions ($F^-$) and bifluoride ions. ($HF^{2-}$) present together.

pH of the formulation is preferably between 1 and 7, or more preferably between 3 and 6 or most preferably between 4 and 5, wherein formulation is diluted with DI water 2 to 500 times at the point of use In certain embodiments, difference between the total normality of the organic acids and the molarity of fluoride compound in the formulation is between −2 and 2 or more preferably between 0 and 2. If the difference is less than −2, etch rates of TEOS and SiN dielectrics would be too low for effective cleaning of the dielectrics. If the difference in greater than 2, the dielectric loss in the cleaning process may be unacceptably high.

For post-CMP cleaning formulations, there may be additional components present which help with cleaning performance. Common types of additives include the following.

Surfactant: Surfactants are used in cleaning chemistries to improve wetting of the surface being cleaned and help remove residues from the surface, without redepositing on the surfaces. Surfactant addition will also reduce the surface tension of the solution, preferably by 10 dynes/cm, or more preferably by 20 dynes/cm, or most preferably by 30 dynes/cm. The surface tension of post-CMP solution containing surfactant when diluted 50 times with water is preferably between 15 to 75 dynes/cm, or more preferably between 20 to 60 dynes/cm, or most preferably between 20 to 50 dynes/cm. Surfactants may also reduce water-marks on the surface, which are the defects formed during the drying phase, which follows cleaning. Any type of surfactant anionic/cationic/non-ionic/zwitterionic or combinations thereof may be used. The choice of this surfactant may depend upon various criteria, including; wetting properties, foaming properties, detergency, rinsability, etc. A combination of surfactants may also be used, wherein one surfactant is used to solubilize a less soluble hydrophobic surfactant molecule.

The compositions of the present invention optionally comprise a surfactant, which, in part, aids in protecting the wafer surface during and after polishing to reduce defects in the wafer surface. Surfactants may also be used to control the removal rates of some of the films used in polishing such as low-K dielectrics. Suitable surfactants include non-ionic surfactants, anionic surfactants, cationic surfactants, ampholytic surfactants, and mixtures thereof.

Non-ionic surfactants may be chosen from a range of chemical types including but not limited to long chain alcohols, ethoxylated alcohols, ethoxylated acetylenic diol surfactants, polyethylene glycol alkyl ethers, propylene glycol alkyl ethers, glucoside alkyl ethers, polyethylene glycol octylphenyl ethers, polyethylene glycol alkylphenyl ethers, glycerol alkyl esters, polyoxyethylene glycol sorbiton alkyl esters, sorbiton alkyl esters, cocamide monoethanol amine, cocamide diethanol amine dodecyl dimethylamine oxide, block copolymers of polyethylene glycol and polypropylene glycol, polyethoxylated tallow amines, fluorosurfactants. The molecular weight of surfactant may range from several hundreds to over 1 million. The viscosities of these materials also possess a very broad distribution.

Anionic surfactants include, but are not limited to salts with suitable hydrophobic tails, such as alkyl carboxylate, alkyl polyacrylic salt, alkyl sulfate, alkyl phosphate, alkyl bicarboxylate, alkyl bisulfate, alkyl biphosphate, such as alkoxy carboxylate, alkoxy sulfate, alkoxy phosphate, alkoxy bicarboxylate, alkoxy bisulfate, alkoxy biphosphate, such as substituted aryl carboxylate, substituted aryl sulfate, substituted aryl phosphate, substituted aryl bicarboxylate, substituted aryl bisulfate, and substituted aryl biphosphate etc. The counter ions for this type of surfactants include, but are not limited to potassium, ammonium and other positive ions. The molecular weights of these anionic surface wetting agents range from several hundred to several hundred-thousand.

Cationic surfactants possess the positive net charge on major part of molecular frame. Cationic surfactants are typically halides of molecules comprising hydrophobic chain and cationic charge centers such as amines, quaternary ammonium, benzylalkonium, and alkylpyridinium ions.

In another aspect, the surfactant can be an ampholytic surfactant, which possess both positive (cationic) and negative (anionic) charges on the main molecular chains and with their relative counter ions. The cationic part is based on primary, secondary, or tertiary amines or quaternary ammonium cations. The anionic part can be more variable and include sulfonates, as in the sultaines CHAPS (3-[(3-Cholamidopropyl)dimethylammonio]-1-propanesulfonate) and cocamidopropyl hydroxysultaine. Betaines such as cocamidopropyl betaine have a carboxylate with the ammonium. Some of the ampholytic surfactants may have a phosphate anion with an amine or ammonium, such as the phospholipids phosphatidylserine, phosphatidylethanolamine, phosphatidylcholine, and sphingomyelins.

Examples of surfactants also include, but are not limited to, dodecyl sulfate sodium salt, sodium lauryl sulfate, dodecyl sulfate ammonium salt, secondary alkane sulfonates, alcohol ethoxylate, acetylenic surfactant, and any combination thereof. Examples of suitable commercially available surfactants include Hostapur® SAS-30 by Clariant Chemicals, TRITON™, Tergitol™, DOWFAX™ family of surfactants manufactured by Dow Chemicals and various surfactants in SURFYNOL™, DYNOL™, Zetasperse™, Nonidet™, and Tomadol™ surfactant families, manufactured by Air Products and Chemicals. Suitable surfactants of surfactants may also include polymers comprising ethylene oxide (EO) and propylene oxide (PO) groups. An example of EO-PO polymer is Tetronic™ 90R4 from BASF Chemicals.

In preferred embodiments, surfactant comprises both ethoxylate and propyloxylate groups.

In another embodiment, surfactant is a linear molecule that can be represented by following structure where m ranges between 1 and 100 and n ranges between 0 and 100.

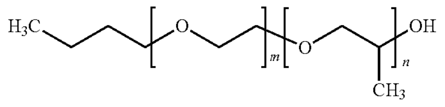

An example with surfactant with this structure is Tergitol™ MinFoam 1× from Dow Chemicals.

Surfactants that are particularly useful in these formulations are the ones which are stable in high ionic strength and in the presence of fluoride species. Without holding to any particular theory, at high ionic strength the repulsive force between two surfactant molecules is reduced substantially, resulting in molecules coming close to each other, thereby making the solutions cloudy or turbidity. Such turbid solutions are likely unacceptable in advanced semiconductor manufacturing since the particle count measurement in the solutions will have unacceptably high values. High ionic strength is a result of high concentration of additives that have ionizable groups. Ionic strength can be determined by conductivity measurements performed at 25° C. Preferably the surfactant should be stable in solutions without any turbidity or precipitation at concentration of at least 0.1 wt. % in solutions with conductivity of at least 40 mS/cm. It may be desired that the surfactant should be stable in solutions at even higher conductivity such as 60 mS/cm or 80 mS/cm.

It is desirable that the surfactant has two more anionic group. Surfactants with two or more anionic groups will likely have sufficient electrostatic field even in high ionic solutions. Therefore the surfactant solutions will be stable. In some preferred embodiments, the surfactant will have two or more sulfonic acid groups.

A preferred surfactant is a diphenyl disulfonic acid or its salt. Structure of the preferred surfactant is shown below

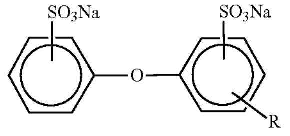

Wherein R is a group selected from H, or a linear or branched alkyl group with carbon chain length between 1 and 20.

Example of surfactants with such structure include Dowfax 2A1, Dowfax 3B2, Calfax DBA70.

In another preferred embodiment the surfactant is a fluorosurfactant. Examples of fluorosurfactants include but not limited to perfluorooctanesulfonic acid (PFOS), perfluorooctanoic acid (PFOA), and perfluorononanoic acid (PFNA), perfluorohexanoic acid (PFHxA), perfluorobutanesulfonic acid or perfluorobutane sulfonate (PFBS).

The surfactants may be used at concentrations from 0.0001 wt. % to 10 wt. %, or more preferably between 0.01 wt. % and 3 wt. % and most preferably between 0.05 wt. % and 1 wt. %.

The cleaning chemistry may optionally contain chelating agent. Since a chelating agent may be more selective with regard to one metal ion over another, a plurality of chelating agents or salts thereof are used in the compositions described herein. It is believed that these chelating agents may bind to metal ion contaminants on the substrate surface and dissolve them into the composition. Further, in certain embodiments, the chelating agent should be able to retain these metal ions in the composition and prevent the ions from re-depositing on the substrate surface. Examples of suitable chelating agents that may be used include, but are not limited to: ethylenediaminetetracetic acid (EDTA), N-hydroxyethylethylenediaminetriacetic acid (NHEDTA), nitrilotriacetic acid (NTA), diethylklenetriaminepentacetic acid (DPTA), ethanoldiglycinate, citric acid, gluconic acid, oxalic acid, phosphoric acid, tartaric acid, methyldiphosphonic acid, aminotrismethylenephosphonic acid, ethylidene-diphosphonic acid, 1-hydroxyethylidene-1,1-diphosphonic acid, 1-hydroxypropylidene-1,1-diphosphonic acid, ethylaminobismethylenephosphonic acid, dodecylaminobismethylenephosphonic acid, nitrilotrismethylenephosphonic acid, ethylenediaminebismethylenephosphonic acid, ethylenediaminetetrakismethylenephosphonic acid, hexadiaminetetrakismethylenephosphonic acid, diethylenetriaminepentamethylenephosphonic acid and 1,2-propanediaminetetetamethylenephosphonic acid or ammonium salts, organic amine salts, malonic acid, succinic acid, dimercapto succinic acid, glutaric acid, maleic acid, phthalic acid, fumaric acid, polycarboxylic acids such as tricarbaryl acid, propane-1,1,2,3-tetracarboxylic acid, butane-1,2,3,4-tetracarboxylic acid, pyromellitic acid, oxycarboxylic acids such as glycolic acid, .beta.-hydroxypropionic acid, citric acid, malic acid, tartaric acid, pyruvic acid, diglycol acid, salicylic acid, gallic acid, polyphenols such as catechol, pyrogallol, phosphoric acids such as pyrophosphoric acid, polyphosphoric acid, heterocyclic compounds such as 8-oxyquinoline, and diketones such as .alpha.-dipyridyl acetylacetone.

The chelating agent may be used at a concentration ranging from 0.01 wt. % to 30 wt. %

The cleaning chemistry may optionally contain defoaming compounds. The defoamer or an anti-foaming agent is a chemical additive that reduces and hinders the formation of foam in the formulation. The terms anti-foam agent and defoamer are often used interchangeably. Commonly used agents are insoluble oils, polydimethylsiloxanes and other silicones, certain alcohols, stearates and glycols, certain surfactants such as a combination of polyether surfactant and a polyhydric alcohol fatty acid ester, Surfynol MD20 surfactant from Evonik Chemicals. The defoaming compound may be used in a concentration ranging from 0.00001 wt. % to 0.01 wt. % in the cleaning formulation.

The cleaning chemistry may optionally contain biocide. CMP formulations may also comprise additives to control biological growth such as biocides. Some of the additives to control biological growth are disclosed in U.S. Pat. No. 5,230,833 (Romberger et al.) and U.S. patent application Publication No. 2002/0025762, which is incorporated herein by reference. Biological growth inhibitors include but are not limited to tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, sodium hypochlorite, isothiazolinone compounds such as methylisothiazolinone, methylchloroisothiazolinone and benzisothiazolinone. Some of the commercially available preservatives include KATHON™ and NEOLENE™ product families from Dow Chemicals and Preventol™ family from Lanxess.

The preferred biocides are isothiozilone compounds such as methylisothiazolinone, methylchloroisothiazolinone and benzisothiazolinone The CMP polishing compositions optionally contain a biocide ranging from 0.0001 wt. % to 0.10 wt. %, preferably from 0.0001 wt. % to 0.005 wt. %, and more preferably from 0.0002 wt. % to 0.0025 wt. % to prevent bacterial and fungal growth during storage.

Chemistries containing such polymers may be used in a variety of cleaning applications, which demand removal of residues from a surface. The residues may be inorganic or organic in nature. Examples of processes, where formulations containing these polymers may be effective, include; post-CMP cleaning, photo-resist ash residue removal, photoresist removal, and various applications in back-end packaging, such as; pre-probe wafer cleaning, dicing, grinding etc. as well as cleaning of wafers for photovoltaic applications.

The compositions of this invention are especially suitable for cleaning semiconductor wafers comprising at least one or more of metallic or dielectric films on the surface. Metallic films may comprise interconnect metal lines or vias comprising copper, tungsten, cobalt, aluminum, ruthenium, titanium, Germanium-Antimony-Tellurium (GST), or their alloys. The dielectric layer can be silicon oxide films such as those derived from Tetra Ethyl Ortho Silicate (TEOS) precursors, dielectric films with one or more elements such as silicon, carbon, nitrogen, oxygen and hydrogen. Dielectric films can be porous or non-porous or the structures may comprise air gaps.

Cleaning compositions may be used for cleaning the wafer surface with various types of cleaning techniques including but not limited to brush box cleaning, spray cleaning, megasonic cleaning, buff cleaning on a pad, single wafer spray tools, batch immersion cleaning tools, etc.

In certain preferred embodiments, the cleaning composition when diluted with water can etch the dielectric films at an etch rate preferably between 0.2 to 50 Angstroms/min, or more preferably between 1 and 20 Angstroms/min at room temperature.

In some preferred embodiments, room temperature etch rates of metallic films (tungsten and titanium nitride) is very low, preferably less than 10 Angstroms/min, or more preferably less than 5 Angstroms/min or most preferably less than 2 Angstroms/min Formulations of this invention are especially suitable for post-CMP cleaning application for tungsten. Tungsten CMP results in metallic residues comprising W, Tl and Fe, which can form invisible residues on the dielectric surface. These residues can increase leakage currents and reduce the effectiveness of the semiconductor devices. Titanium particularly is a very difficult to remove from the wafer surface as titanium is generally stable as solid oxide phase over a broad pH range. Formulations of this invention because of suitable organic acids and the dielectric etching capability are able to effectively remove the titanium residues and improve electrical performance of the devices.

Formulations or the components of the formulation may be purified and filtered while making of the formulation or using the formulations. In some embodiments, formulations can be made into two or more components and mixed at the point of use.

The cleaning compositions and methods described herein will be illustrated in more detail with reference to the following examples, but it should be understood that it is not deemed to be limited thereto.

All post CMP cleaning compositions used in the working example had a pH between 4 and 5.

WORKING EXAMPLES

Example 1

This example performed electrochemical tests to characterize Ti removal.

Table 1 provides the passivation current densities of various chemicals tested at 0.2 wt. % concentration

TABLE 1

| Components | Passivation Current Density (nA/cm@) |
|---|---|
| Etidronic acid | 169 |
| Ammonium phosphate dibasic | 142 |
| Gluconic acid hydroxycarboxylic acids | 284 |
| Lactic acid hydroxycarboxylic acids | 330 |
| Formic Acid | 255 |
| Ethylene diamine | 131 |
| Citric Acid hydroxycarboxylic acids | 326 |
| Oxalic Acid | 208 |
| Malonic Acid | 204 |

In acidic pH, Ti showed passivation behavior at anodic potentials. The steady state passivation current density was a result of equilibrium between oxide film formation and oxide film dissolution. So, the steady state passivation current density could serve as a proxy for ability of the solution to dissolve titanium residues.

Example of polarization diagrams was shown in FIG. 1.

Data shows that hydroxycarboxylic acids (def. any carboxylic acid with at least one hydroxy group) such as citric acid, gluconic acid, lactic acid show high passivation current densities, indicating strong ability to complex Ti compounds.

citric acid, gluconic acid, lactic acid, formic Acid, oxalic Acid, malonic Acid

Example 2

TEOS wafers were polished on Mirra®, manufactured by Applied Materials, 3050 Boweres Avenue, Santa Clara, California, 95054. On Platen 1 the wafers were polished with a commercial tungsten bulk polishing slurry for 1 minute on IC1000 pad from Dow Chemicals, Cleaning was performed on Ontrak cleaner using two brush boxes with a cleaning recipe comprising 30 second chemical dispense and 20 seconds DI water rinse in the first brush box and 10 second chemical dispense and 40 seconds DI water rinse in the second brush box station.

TABLE 2

| | C1 | C2 | C3 | C4 |
|---|---|---|---|---|
| Citric Acid (wt. %) | 4 | | 13.79 | |
| Oxalic (wt. %) | 4 | 9.04 | | |
| Malonic (wt. %) | 2 | | | 7.47 |
| AA-AMPS Polymer (wt. %) | 0.525 | 0.525 | 0.525 | 0.525 |

Concentrated Cleaning compositions described were made as per Table 2. The acid concentrations were chosen to provide same molarity. The remainder of the composition was water. These chemistries were further diluted with water and 40% ammonium fluoride as per ratios in Table 3.

In order to characterize defect removal and trace metals removal capability, following test sequence was performed. For each formulation, 3 oxide dummies were polished, followed by 3 TEOS monitors using ex-situ pad conditioning. Then the pad was contaminated by polishing 3 TiN wafers without any pad conditioning. This was followed by a TEOS wafer monitor which was examined by Vapor Phase Decomposition Inductively Coupled Plasma Mass Spectrometry (VPD-ICPMS) to determine metallic contamination remaining on the surface.

First three TEOS monitor wafers were analyzed using Surfscan™ SP2 from KLA-Tencor with 0.07 micron sensitivity.

Additionally, etch rates were measured on TEOS, Tl and W wafers at room temperatures.

TABLE 3

| Diluted chemistry | Concentrated Chemistry Used | Chem (gm) | NH4F (40%) (gm) | Water (gm) |
|---|---|---|---|---|
| D1 | C1 all 3 acids | 10 | 1.25 | 988.75 |
| D2 | C1 | 15 | 1.87 | 983.13 |
| D3 | C1 | 20 | 2.50 | 977.50 |
| D4 | C1 | 20 | 5 | 975 |
| D5 | C2 Oxalic | 20 | 2.50 | 977.50 |
| D6 | C3 Citric | 20 | 2.50 | 977.50 |
| D7 | C4 malonic | 20 | 2.50 | 977.50 |

Etch rates were measured at room temperatures with stirring. Etching times for TEOS was 30 minutes. Etching time for W and Ti films was 5 minutes. TEOS etch rates were measured using ellipsometry techniques, whereas W and Ti etch rates were measured using four-point probe technique.

Table 4 summarized the data.

Table 4 showed that hydroxycarboxylic acid like citric acid (D6) provides better Ti removal. Dicarboxylic acid like Oxalic acid (D5) is more suitable for Fe removal. Citric acid also provides excellent defectivity. By using ammonium fluoride, the defectivity on TEOS can be reduced significantly through increase in TEOS etch rates (D4?).

TABLE 4

| Diluted chemistry | No Defects >0.07 Microns | Ti (1E9 atoms/ $cm^2$) | Fe (1E9 atoms/ $cm^2$) | TEOS Etch Rate (Å/min) | Ti Etch Rate (Å/min) | W Etch rate (Å/min) |
|---|---|---|---|---|---|---|
| D1 | 4188 | 110 | 340 | 0.80 | 1.2 | 0 |
| D2 | 3388 | 190 | 190 | 1.93 | 2.5 | 0 |
| D3 | 3026 | 270 | 160 | 3.70 | 0 | 0 |
| D4 | 1789 | 78 | 210 | 11.40 | 0.2 | 0 |
| Oxalic D5 | 2915 | 420 | 120 | 3.50 | 0 | 0 |
| Citric D6 | 1687 | 240 | 280 | 2.43 | 0.2 | 0 |
| malonicD7 | 2437 | 530 | 240 | 2.47 | 0.5 | 0 |

Example 3

Following formulations were made as shown in Table 5. All formulations had NH4F and water.

Dowfax 2A1, Dowfax 3B2, Calfax DBA70 and Calfax 10L-45 are proprietary surfactants containing diphenyl disulfonic structure with an alkyl group.

Hostapur SAS is a secondary alkane sulfonic acid surfactant with only one sulfonic acid group. Tergitol Minfoam 1× is a non-ionic surfactant.

TABLE 5

| | C5 | C6 | C7 | C8 | C9 | C10 | C10 |
|---|---|---|---|---|---|---|---|
| Citric Acid (wt. %) | 4 | 4 | 4 | 4 | 4 | 4 | 4 |
| Oxalic (wt. %) | 4 | 4 | 4 | 4 | 4 | 4 | 4 |
| Malonic (wt. %) | 2 | 2 | 2 | 2 | 2 | 2 | 2 |
| AA-AMPS Polymer (wt. %) | 0.525 | 0.525 | 0.525 | 0.525 | 0.525 | 0.525 | 0.525 |
| Hostapur SAS (wt. %) | | 0.375 | | | | | |
| Tergitol MinFoam 1 x | | | 0.375 | | | | |
| Calfax DBA70 | | | | 0.375 | | | |
| Dowfax 2A1 | | | | | 0.375 | | |
| Dowfax 3B2 | | | | | | 0.375 | |
| Calfax 10L-45 | | | | | | | 0.375 |
| Ammonium Fluoride (wt. %) | 5 | 5 | 5 | 5 | 5 | 5 | 5 |
| Appearance | Cloudy | Cloudy | Cloudy | Clear | Clear | Clear | Clear |

Data in Table 5 showed that formulations C6 and C7 were cloudy while C8-C10 were clear. Conductivity of all solutions measured at 250° C. was approximately 90 mS/cm Therefore, it is clearly evident that the surfactant with two sulfonic acid groups are stable in formulations with very high conductivity (~90 mS/cm).

Example 4

Formulations were made with different additives (polymers and surfactants) added to a base chemistry comprising 13.79 wt. % citric acid and 5 wt. % ammonium fluoride and remainder being water. The formulation was diluted 1 part formulation to 49 parts water. Additives were then added to the diluted formulations at 0.2 wt. % concentration as described in table 6.

For the cleaning evaluation, polished tungsten wafer pieces were first contaminated by immersing in 3 wt. % colloidal silica (Fuso PL-3 Particles) slurry with pH 2.3 for 30 minutes, creating a tungsten surface almost completely covered with particles. The pieces were then cleaned by immersing in the cleaning solution for 5 minutes with stirring. Particle cleaning was evaluated by scanning electron microscopy at 10000 magnification. The cleaning performance was subjectively classified as excellent (particle area coverage after cleaning is <10% of the area imaged), moderate (particle area coverage after cleaning is between 10-50% of the area imaged) and poor (particle area coverage after cleaning is over 50%).

TABLE 6

| Additive | Cleaning Performance |
|---|---|
| AA-AMPS Polymer | Poor? |
| Diallyldimethylammonium chloride | Poor |
| Low molecular weight Diallyldimethylammonium chloride (Induquat ECR 35L) | Poor |
| Dodecyltrimethylammonium hydroxide | Poor |
| polyethylenimine) MW 600 | Poor |
| polyethylenimine) MW 750,000 | Poor |
| Poly(2-acrylamido-2-methyl-1-propanesulfonic acid) solution | Poor |
| Poly(4-sytrenesulfonic acid) ammonium salt, 30% 200,000 MW | Poor |
| Poly(4-styrenesulfonic acid-co-maleic acid) sodium salt sol'n, | Poor |
| Poly(4-sytrenesulfonic acid), 75,000 MW | Poor |
| Poly(acrylamide-co-diallyldimethylammonium chloride) solution (P(Aam-co-DADMAC)) | Poor |
| Polyethylene glycol), MW 12000 | Excellent |
| Polyvinylpyrrolidone avg mol wt 10,000 | Poor |
| Poly(ethylene glycol), MW 400 | Excellent |

TABLE 6-continued

| Additive | Cleaning Performance |
|---|---|
| Poly(ethylene glycol), MW 1000 | Excellent |
| Poly(ethylene glycol), MW 4000 | Excellent |
| Pluronic L64 (EO13-PO30-EO13) | Excellent |
| Pluronic 17R4 (PO14-EO24-PO14) | Excellent |

As evident from this table that only those formulations comprising additives with polyethylene glycol groups such as polyethylene glycol (Molecular weights 400, 1000, 4000, 12000), copolymers of polyethylene glycol (PEO) and polypropylene glycol (PPO) such as Pluronic L64 and Pluronic 17R4 provide excellent cleaning performance.

Example 5

TEOS and SiN wafers were polished with a tungsten buff slurry and cleaned on Mirra polisher using IC1000 pad. The concentrate formulations used were summarized in table 7. Formulations were diluted 1 part formulation to 49 parts water to create point of use cleaning formulations. These formulations were used on Ontrak DSS200 cleaner to clean the wafers. Cleaning was performed on Ontrak cleaner using two brush boxes with a cleaning recipe comprising 30 second chemical dispense and 320 seconds DI water rinse in the first brush box and 10 second chemical dispense and 40 seconds DI water rinse in the second brush box station.

Table 7 also summarized the number of defects measured on TEOS and SiN wafers using KLA Surfscan SP2 defect metrology tool.

Additionally tungsten cleaning was performed using the methodology described in example 4. The silica particle cleaning ability from tungsten surface is also summarized in table 9.

TABLE 7

| Formulation# | Formulation | TEOS Defects (>0.07 um) | SiN Defects >0.1 um | Silica particle removal ability from tungsten surface |
|---|---|---|---|---|
| C11 | Citric Acid (13.79 wt. %) + AA-AMPS Polymer (0.525 wt. %) + 7% Ammonium Fluoride | 225 | 214 | Poor |
| C12 | Citric Acid (13.79 wt. %) + Polyethylene Glycol MW 8000 (0.525 wt. %) + 7% Ammonium Fluoride | 303 | 5416 | Excellent |
| C13 | Citric Acid (13.79 wt. %) + AA-AMPS Polymer (0.525 wt. %) + Polyethylene Glycol MW800 (0.5 wt. %) + 7% Ammonium Fluoride | 245 | 601 | Excellent |
| C14 | 2% Ammonia | 2596 | 513 | Excellent |

It is evident that the formulations C11 and C13 comprising anionic polymer (Dequest P9030) provides better cleaning of SiN surfaces. However anionic polymers are not effective for cleaning non-surface modified silica particles from tungsten surface as evident from table 8. However formulation C13 comprising both anionic polymer and a polymer comprising polyethylene glycol group can provide excellent cleaning of all surfaces involved TEOS, SiN and tungsten. The results also shows significant improvement in defects with formulations of this inventions relative to 2% ammonia solution, which is commonly used for post-CMP cleaning in the industry.

Example 6

Formulations listed in table 7 were used for cleaning TEOS wafers which were previously measured for defect numbers using KLA Surfscan SP2. Wafers were passed through Ontrak brush box cleaner. Only the second brush box was used for cleaning. In this second brush box, formulation was dispensed for 30 seconds without the rinse step in the brush box. The wafer was then passed to the spin-rinse dry station for drying. The defects on the TEOS wafers were measured after this processing. Increase in defects (defect adders) after processing would indicate that the defects arising from incomplete rinsing of the cleaning chemistry. It is highly desirable that the cleaning chemistry is easily rinsed off and the defect adders from the incomplete rinsing be minimal.

TABLE 8

| | Defect adders on TEOS (>0.07 um) |
|---|---|
| C11 | 1856 |
| C12 | 140 |
| C13 | 16 |
| C14 | 347 |

Table 8 shows the defect adders for different chemistries. It is evident that the chemistry with non-ionic polymers comprising ethylene oxide (C12 and C13) have lowest defect adders, indicating that the cleaning chemistry can be rinsed-off easily from the surface, which is important for increasing the cleaning process window.

Example 7

Ability to remove small particles from TEOS surface was evaluated by drying a drop of slurry comprising approximately 20% Fuso PL-3 particles on a TEOS wafer coupon. Formulation C1 from table 2 was diluted with water and 40% ammonium fluoride as described in table 9. The wafer coupon with dried slurry was immersed in the cleaning solution for 15 minutes with stirring. After 156 minutes, the coupons were rinsed and dried. The coupons were examined under scanning electron microscope to determine the silica particle residue removal. The formulation without ammonium fluoride (D9) showed virtually no removal of dried silica residues, whereas the formulation comprising ammonium fluoride (D8) showed great reduction in silica residue removal. This indicates that ammonium fluoride addition is helpful in removal of silica residues.

TABLE 9

| Formulation Number | Concentrate C1 (gm) | 40% Ammonium Fluoride (gm) | Water (gm) |
|---|---|---|---|
| D8 | 2 | 0.25 | 97.75 |
| D9 | 2 | 0 | 98 |

While the invention has been described in conjunction with specific embodiments thereof, it is evident that many alternatives, modifications, and variations will be apparent to those skilled in the art in light of the foregoing description. Accordingly, departures may be made from such details without departing from the spirit or scope of the general inventive concept.

The invention claimed is:

1. A post Chemical Mechanical Planarization (CMP) cleaning composition consisting of:

at least one organic acid or salts thereof selected from the group consisting of dicarboxylic acid, hydroxycarboxylic acid, salts thereof, and combinations thereof;

a fluoride compound selected from the group consisting of ammonium fluoride, ammonium bifluoride, quaternary ammonium fluoride and combinations thereof; at least one polymeric additive selected from the group consisting of acrylic acid-acrylamido propane sulfonic acid copolymer and salts thereof; poly(acrylic acid) and salts thereof; poly(2-acrylamido-2-methyl-1-propanesulfonic acid) and salts thereof; carboxymethyl cellulose; methyl cellulose; hydroxypropyl methyl cellulose; poly-(1-vinylpyrrolidone-co-2-dimethylaminoethyl methacrylate); poly(sodium 4-styrenesulfonate); polyethylene glycol, poly(4-styrenesulfonic acid) and salts thereof; polypropylene glycol; polyacrylamide; poly(acrylamide/acrylic acid) copolymer and salts thereof; and combinations thereof; and water;

optionally a surfactant having two or more sulfonic acid groups;

biological preservative selected from the group consisting of methylisothiazolinone, methylchloroisothiazolinone, benzisothiazolinone, and combinations thereof; and pH adjusting agent;

wherein the composition has a pH of between 1 to 7.

2. The post CMP cleaning composition of claim 1, wherein the at least one organic acid or salts thereof ranges from 1 to 30 wt. %, the polymeric additive ranges from 0.1 to 3 wt. %, the fluoride compound ranges from 1 to 25 wt. %, and the post CMP cleaning composition is optionally diluted with deionized (DI) water 2 to 500 times at point of use.

3. The post CMP cleaning composition of claim 1, wherein the polymeric additive is a polymer comprising propylene oxide.

4. The post CMP cleaning composition of claim 1, wherein the post CMP cleaning composition comprises 0.5 to 5 wt. % oxalic acid or salts thereof, 0.5 to 5 wt. % citric acid or salts thereof, and 0.5 to 5 wt. % malonic acid or salts thereof; and 0.1 to 2 wt. % polymeric additive selected from the group consisting of acrylic acid-acrylamido propane sulfonic acid copolymer, poly(acrylic acid), polypropylene glycol, and combinations thereof; and 1 to 25 wt. % of fluoride compound.

5. The post CMP cleaning composition of claim 1, wherein the post CMP cleaning composition comprises 1 to 30 wt. % citric acid or salts thereof; 0.1 to 3 wt. % polymeric additive selected from the group consisting of acrylic acid-acrylamido propane sulfonic acid copolymer, and polypropylene glycol; and 1 to 25 wt. % of fluoride compound.

6. The post CMP cleaning composition of claim 1, wherein the post CMP cleaning composition comprises 0.0001 wt. % to 10 wt. % a surfactant; wherein the surfactant is stable in the composition having conductivity of ≥40 mS/cm without any turbidity or precipitation.

7. The post CMP cleaning composition of claim 1, wherein the surfactant comprises at least two negatively charged anionic groups.

8. The post CMP cleaning composition of claim 1, wherein the surfactant is a diphenyl disulfonic acid or its salt having a structure of

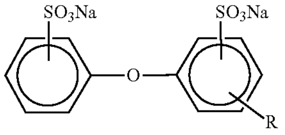

wherein R is selected from H, or a linear or branched alkyl group with carbon chain length between 1 and 20.

9. A system for post Chemical Mechanical Planarization (CMP) cleaning semiconductor wafer comprising at least one surface selected from the group consisting of metallic film, dielectric film, and combinations thereof, comprising the semiconductor wafer; and the post Chemical Mechanical Planarization (CMP) cleaning composition of claim 1 wherein the at least one surface is in touch with the post CMP cleaning composition.

10. A method of post Chemical Mechanical Planarization (CMP) cleaning semiconductor wafer comprising at least one surface selected from the group consisting of metallic film, dielectric film, and combinations thereof, comprising providing the semiconductor wafer;

providing the post Chemical Mechanical Planarization (CMP) cleaning composition of claim 1; and cleaning the semiconductor wafer using the post CMP cleaning composition.

* * * * *